United States Patent [19]

Angle

[11] 4,387,354
[45] Jun. 7, 1983

[54] CCD TRIPLE-SPLIT GATE ELECTRODE TRANSVERSAL FILTER

[75] Inventor: Rodney L. Angle, Somerville, N.J.

[73] Assignee: RCA Corporation, New York, N.Y.

[21] Appl. No.: 297,768

[22] Filed: Aug. 31, 1981

[51] Int. Cl.³ .................. H03H 15/02; G11C 27/02; H01L 27/10

[52] U.S. Cl. ........................................ 333/165; 377/62

[58] Field of Search .............. 333/165, 166, 173; 357/24 R; 307/221 D; 328/167

[56] References Cited

U.S. PATENT DOCUMENTS

| | | | |
|---|---|---|---|
| 4,080,581 | 3/1978 | Sakave et al. | 357/24 X |
| 4,086,609 | 4/1978 | Foxall et al. | 333/166 |
| 4,156,858 | 5/1979 | Weckler et al. | 333/165 |
| 4,264,884 | 4/1981 | Auzet et al. | 307/221 D |

OTHER PUBLICATIONS

"IEEE Journal of Solid-State Circuits," vol. SC-14, No. 1, Feb. 1979; pp. 80-84.

Primary Examiner—Marvin L. Nussbaum
Attorney, Agent, or Firm—Joseph S. Tripoli; George J. Seligsohn

[57] ABSTRACT

By dividing the split gate electrode into four sections, in which two non-adjacent sections are solely clock sections and the other two sections are "plus" and "minus" sections, respectively, and in which the sum of the lengths of the first two sections, in serial order, is substantially equal to the sum of the last two sections, in serial order, only a single mask must be changed, in the fabrication of transversal filters that exhibit a small common mode, in order to change the particular filter characteristic of a fabricated filter.

8 Claims, 7 Drawing Figures

CCD TRIPLE-SPLIT GATE ELECTRODE TRANSVERSAL FILTER

This invention relates to a charge-coupled device (CCD) split gate electrode transversal filter and, more particularly, to one having improved architecture.

Reference is made to the article "Double-Split-Electrode Transversal Filter For Telecommunication Applicants," by Ibrahim, Hupe and Foxall, appearing in the *IEEE Journal of Solid-State Circuits*, Vol. SC-14, No. 1, February, 1979. The advantage over previous CCD split gate electrode filters of the technique described in this article is that the common-mode signal is reduced and minimized. This reduces the requirements on the sense amplifiers. However, the disadvantage of the architecture of the filter described in this article is that its fabrication requires a different set of three masks for each different filter design.

The architecture of the CCD split-gate-electrode transversal filter of the present invention retains all the advantages of the double-split-electrode transversal filter described in the aforesaid article. In addition, however, the architecture employed by the filter of the present invention has the further advantage of requiring a change in only a single mask for the fabrication of each filter design having different filter characteristics.

More specifically, both the CCD split gate electrode transversal filter described in the aforesaid article and the CCD split gate electrode transversal filter of the present invention are operated by multi-phase clock voltages, and both filters are of the type comprised of a semiconductor substrate surface on which pair of substantially equidistant potential barriers defines a CCD channel of a given width. Gate electrodes of the filter extend the given width between the potential barriers, with the gate electrodes being arranged in respective sets corresponding to each of the multi-phase clock voltages. Respective members of each set are distributed along the length of the channel in interleaved relationship with respective members of the other sets. Certain members of a certain one of these sets are each split into a plurality of separate sections arranged in serial order across the given width of the channel. A "plus" summing bus electrically connects together first corresponding sections of the members of this certain one of the sets, and a "minus" summing bus electrically connects together second corresponding sections of the certain members of this certain one of the sets. However, in accordance with the improved architecture of the CCD split gate electrode transversal filter of the present invention, the filter includes at least one triple-split gate electrode comprised of four serially oriented longitudinal sections. The sum of the lengths of the first two sections in serial order is substantially equal to the sum of the lengths of the last two sections in serial order. Further, first means are provided for operating two non-adjacent ones the four sections as solely clock sections and second means are providing for operating the other two of the four sections, respectively, as a "plus" section and as a "minus" section of the filter.

In the drawings:

FIGS. 1 and 1a diagrammatically illustrate the architecture of the double-split electrode transversal filter of the aforesaid article.

FIG. 1b illustrates the shape of a potential well formed by a transversal filter having the type of architecture shown in FIGS. 1 and 1a;

Figure 1:
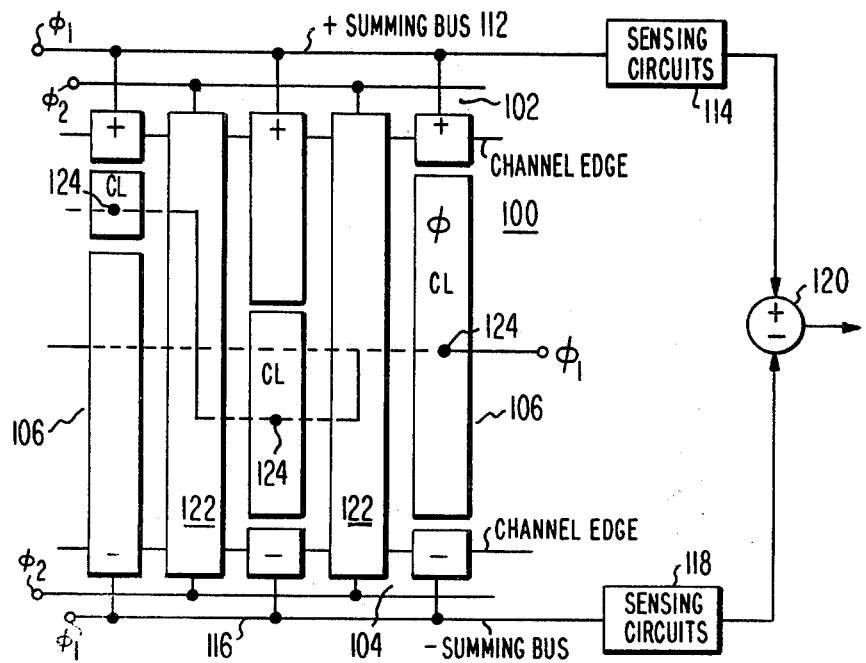
Figure 1A:
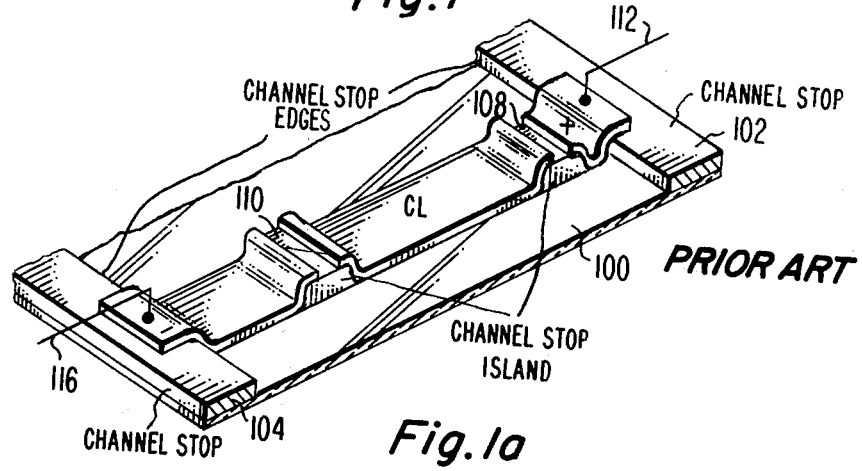

Referring to FIGS. 1 and 1a, there is shown prior art architecture for a transversal filter of the type described in the aforesaid article. More specifically, semiconductor surface 100 of given conductivity, such as P silicon, includes a channel of given width defined by the edges of a pair of substantially equidistant potential barriers comprised of thick oxide regions 102 and 104 which operate as channel stops. Extending the given width of the channel between channel stops 102 and 104 is a first set of double-split gate electrodes 106. As clearly shown in FIG. 1a, each of double-split gate electrodes 106 includes a "plus" (+) section extending from channel stop region 102 to thick-oxide region 108 operating as a channel stop island, a clock (CL) section extending from channel stop island 108 to thick oxide region 110 also operating as a channel stop island and a "minus" (−) section extending from channel stop island 110 to channel stop region 104. All the sections of all the double-split gate electrodes 106 shown in FIG. 1 may be comprised of polysilicon, with the splits themselves being formed by those portions of channel stop islands 108 and 110 which do not underlie these sections of polysilicon gate electrode 106. All three of the center sections (CL) of all the first set of gate electrodes 106 have $\phi_1$ phase clock voltages applied thereto. In addition, the "plus" sections of all the first set of gate electrodes 106 are applied in common through "plus" summing bus 112 as an input to sensing circuit 114. All of the "minus" sections of all of the first set of gate electrodes 106 are connected in common through "minus" summing bus 116 as an input to sensing circuit 118. Differential circuit 120 produces an output from the transversal filter which is equal to the difference in the respective outputs from sensing circuits 114 and 118.

Interleaved between each pair of first set double-split gate electrodes 106 is a second set of non-split gate electrodes 122, shown in FIG. 1. $\phi_2$ phase clock voltages are applied to all of second set gate electrodes 122.

The arrangement shown in FIG. 1 and FIG. 1a comprises a two-phase clock voltage CCD arrangement. Multiple-phase clock voltage CCD arrangements that employ more than two phases, are known in the CCD art. In such case, the gate electrodes are arranged in respective sets corresponding to each of the multi-phase clock voltages, with the respective members of each set being distributed along the length of the channel in interleaved relationship with respective members of the other sets. In this latter case, a plurality of non-split gate electrodes, similar to gate electrode 122, of all sets but the first set would be situated between each pair of first set split-gate electrodes, with a different phase clock voltage being applied to each one of these plurality of intervening non-split gate electrodes. For illustrative purposes, in describing the present invention, the two-phase clock voltage CCD arrangement is assumed. However, it should be understood that the invention is applicable to multiple phase clock voltage CCD arrangement that employ more than two phases of clock voltage.

Figure 2:
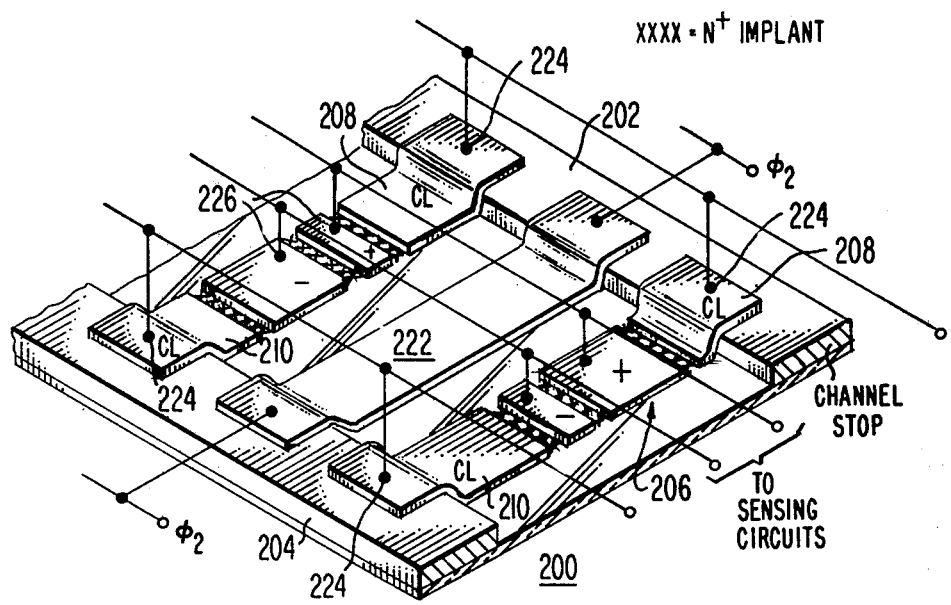
FIG. 2 illustrates a first embodiment of the present invention.

Referring to the embodiment of the present invention shown in FIG. 2, substrate surface 200, channel stop regions 202 and 204 and second set non-split gate electrode 222, having $\phi_2$ phase clock voltage applied thereto, are respectively substantially identical in structure and function to substrate surface 100, gate electrode regions 102 and 104 and second-set non-split gate electrode 122 of FIGS. 1 and 1a. However, the structure of each first-set split gate electrode 206, in FIG. 2, is substantially different from the structure of each first-set split gate electrode 106, in FIGS. 1 and 1a. First, each split gate electrode 206 is a triple-split gate electrode formed of four sections, rather than a double-split gate electrode formed of three sections. Specifically, the four sections comprise a first CL section 208, a "plus" section, a "minus" section and a second CL section 210, extending in that order the width of the channel defined by the edges of channel stop region 202 and channel stop region 204. In accordance with the principles of the present invention, the sum of the respective lengths of the first CL section 208 and the "plus" section of all the first-set split gate electrodes 206 lie on one side of the mid-line of the channel and are substantially equal in length to the sum of the lengths of second CL section 210 and "minus" section of all the first-set gate electrodes 206, which lie on the other side of the mid-line of the channel. Therefore, the sum of the lengths of the sections of split gate electrode 206 lying on one side of the mid-line of the channel and the sum of the lengths of the sections of each split gate electrode 206 lying on the other side of the mid-line of the channel are substantially the same for all first-set split gate electrodes 206 of the filter, and, hence, are independent of the particular design characteristics of the filter. However, the relative lengths of first CL section 208 and the "plus" section and the relative lengths of the second CL section 210 and the "minus" section do vary from one split gate electrode 206 to another in dependence on the particular design characteristics of the filter. As shown in FIG. 2, $\phi_1$ phase clock voltages are applied to all four sections of all first-set split gate electrodes 206. However, as known in the CCD transversal filter art, the "plus" and the "minus" sections of a split gate electrode filter may be left floating during charge-transfer. In this latter case, $\phi_1$ phase clock voltages would be applied to only the first and second CL sections 208 and 210 of all the first-set split gate electrodes 206.

Another structural difference between the split gate transversal filter shown in FIG. 2 and that shown in FIGS. 1 and 1a, is the presence in each of the three-split regions between the four sections of each first-set gate electrode 206 of relatively high doping with implants of a conductivity opposite to that of substrate surface 200. Thus, assuming, in FIG. 2, substrate surface 200 to be comprised of P silicon, each of the split regions are comprised of N+ implants, as indicated by the legend "XXXX" in the drawings.

There are many benefits to be derived from employing the structure of FIG. 2 for a split gate electrode transversal filter, rather than that shown in FIGS. 1 and 1a. First, the respective positions of the channel stop islands 10, the polysilicon sections of first-section split gate electrodes 106 and the metallic electrical contacts on the centrally located CL section of each polysilicon split gate electrode 106 vary from one-split gate electrode 106 to another in dependence on the particular design characteristics of each different filter to be fabricated. However, as is known in the solid-state device fabrication art, a different mask is required to define the respective positions on a chip of (1) channel stops, (2) polysilicon sections of gate electrodes and (3) metallic electrical contacts on the polysilicon sections. Therefore, the fabricated split gate electrode transversal filter employing the structure shown in FIGS. 1 and 1a requires that three of the masks in the mask set be changed or modified for each and every different particular design characteristics split-gate electrode transversal filter to be fabricated.

In FIG. 2, the respective positions of all the channel stops (regions 202 and 204) and the metallic electrical contacts on the polysilicon sections (including contacts 224 to first and second CL sections 208 and 210) are independent of the particular design characteristics of the split-gate electrode transversal filter to be fabricated. Only the respective positions of the polysilicon sections of the gate electrodes and the N+ implants vary, in the structure shown in FIG. 2, with each different particular design characteristics of the split gate electrode transversal filter to be fabricated. In FIG. 2, only a single mask must be modified, defining the positions of the sections of each one of the first-set polysilicon gate electrodes 206 of the filter, for each different particular design characteristics of the transversal filter to be fabricated. The respective positions for inserting the N+ implants, in FIG. 2, (i.e., the position of the splits between the section of the polysilicon gate electrode 206) are self-aligned by the earlier laying down of the polysilicon gate electrodes in accordance with the single different mask. Thus, there is a saving of two masks for each and every different particular design characteristics transversal filter fabricated in accordance with the structure of FIG. 2, rather than in accordance with the structure of FIGS. 1 and 1a.

Figure 1B:
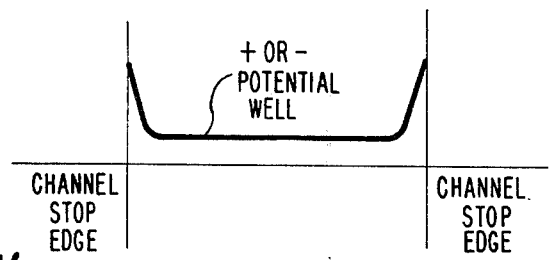
Figure 2A:
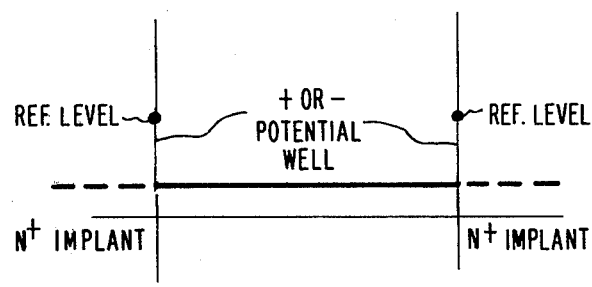
FIG. 2a illustrates the shape of a potential well formed by a transversal filter having the architecture shown in FIG. 2.

There are additional benefits to be gained by employing the structure of FIG. 2, rather than that of FIGS. 1 and 1a. The useful charge of a CCD split gate electrode transversal filter is that stored respectively in the potential well under a "plus" section and in the potential well under "minus" section of a split gate electrode. In the structure shown in FIGS. 1 and 1a, both ends of both the "plus" and the "minus" sections of split gate electrodes 106 overlap either channel stop regions 102 or 104 or channel stop islands 110. As indicated in FIG. 1b, the width of a "plus" or "minus" potential well extends from an edge of a channel stop region 102 or 104 to an edge of a channel stop island 110. However, as also indicated in FIG. 1b, both ends of such a potential well are not well defined, but slope relatively gradually downward. This poor definition is due to the presence of a channel stop at the boundaries of the potential well. By contrast, in the structure of FIG. 2, the ends of a "plus" or "minus" potential well are, in effect, extremely sharp (which is desirable), as indicated in FIG. 2a. The reason for this is that, in the structure of FIG. 2, a "plus" or "minus" potential well is bounded by the edge of an N+ implant, rather than by the edge of a channel stop. An N+ implant does not act as a channel stop, but rather forms a PN junction with the underlying substrate that assumes a potential level substantially equal to that produced by the charge packets partially filling the potential well underlying the split gate electrodes adjacent the N+ implant. Therefore, a constant potential level extends across the channel from the vicinity of channel stop 202 to the vicinity of channel stop 204.

In the structural arrangements of both FIG. 2 and FIGS. 1 and 1a, it is desirable to provide a fixed "minimum" length for the smaller of the "plus" or the "minus" sections of each individual first said split gate electrode of any given transversal filter, and to provide a properly weighted length for the larger of the "plus" or "minus" section of each first-set split gate electrode in accordance with the particular design characteristics of that given filter. The reason for doing so is that it results in the minimization of unwanted capacitance of the "plus" and "minus" sections of the split gate electrodes. In the structure shown in FIGS. 1 and 1a, only the portions of the lengths of the "plus" and "minus" sections of the split gate electrodes which lie in non-overlapping relationship with respect to the channel stop regions 102 and 104 and the channel stop islands 110 contribute to the operation of the CCD transversal filter. However, the entire lengths of the "plus" and "minus" sections of the split gate electrodes contribute to the unwanted capacitance thereof. In the structure shown in FIG. 2, the entire lengths of the "plus" and "minus" sections of the split gate electrodes contribute to the operation of the CCD transversal filter. Because no channel stops are employed in the structure of FIG. 2, the "minimum" length of the smaller of the "plus" or "minus" sections of the split gate electrodes can be reduced in size relative to the "minimum" length needed in the structure of FIGS. 1 and 1a (which must overlap channel stops). This structural difference reduces unwanted capacitance and, in addition, reduces the common mode signal at the inputs to the sense circuits.

In the structure shown in FIG. 2, the electrical contacts 226 of the "plus" and "minus" sections are positioned to overlie active potential well charge-transfer areas of substrate 200. This is not believed by Applicant to be in an impediment. There are those who do believe that the practice of placing an electrical contact directly over a potential well produces an undesired perturbation in the depth of the potential well formed under such sections. The embodiment of the present invention shown in FIG. 3 avoids this practice.

Figure 3:
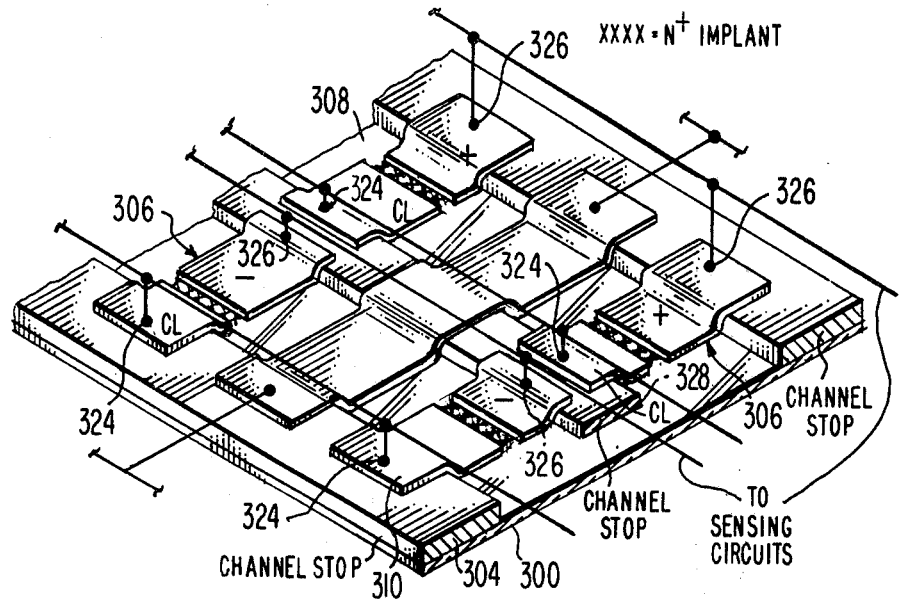
FIG. 3 illustrates a second embodiment of the present invention.

In the structure shown in FIG. 3, a channel defined by channel stop regions 302 and 304 is divided into substantially two equal width sub-channels by channel stop region 328 situated along the mid-line of the channel as shown in FIG. 3. Overlying the sub-channel between channel stop 302 and 328 is "plus" section and first CL section 308 of each first-set split gate electrode 306, with one end of each "plus" section overlapping channel stop 302 and one end of each first CL section 308 overlapping channel stop 328. An N+ implant is situated within the split between a "plus" section and a first CL section 308. Overlying the sub-channel between channel stop 304 and channel stop 328 is a "minus" section and a second CL section 310 have each first-sets split-gate electrode 306, with one end of a "minus" overlapping channel stop 328 and one end of second CL section 310 overlapping channel stop 304. An N+ implant is situated in the split between each "minus" section and second CL section 310. As shown in FIG. 3, electrical contacts 324 of the first and second CL sections and the electrical contacts 326 of the "plus" and the "minus" section are situated over channel stop 302, channel stop 304 or channel stop 328, as the case may be. In all other respects, the structure of FIG. 3 is substantially similar to that of FIG. 2 and that of FIGS. 1 and 1a.

Figure 3A:
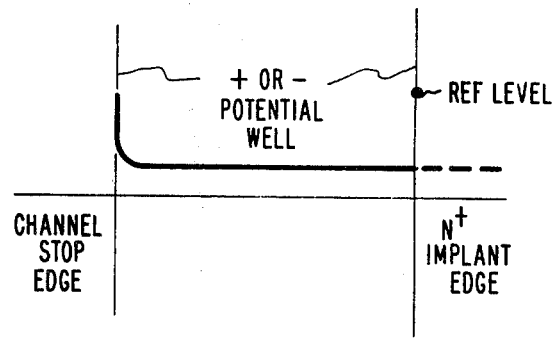
FIG. 3a illustrates a potential well of a transversal filter having the architecture shown in FIG. 3.

The primary benefit of Applicant's invention of requiring only a single different mask for each transversal filter of different particular design characteristics to be fabricated, is preserved by the structure of FIG. 3. However, the secondary benefits of the embodiment shown in FIG. 2 are partially lost in the embodiment of FIG. 3, as indicated by FIG. 3a. As shown in FIG. 3a, of a "plus" or a "minus" potential well is poorly defined by a channel stop edge, as is the case in FIGS. 1 and 1a, while the other potential well end is effectively a sharply defined N+ implant edge, as is the case in the embodiment of FIG. 2.

It is not essential that the "plus" sections overlap channel stop 302 and the "minus" sections overlap channel stop 328, as specifically shown in FIG. 3. However, it is essential to the embodiment of the present invention shown in FIG. 3 that only one of the "plus" and the "minus" sections overlap a channel-defining channel stop, such as either channel stop 302 or channel stop 304 and the other of the "plus" and the "minus" sections overlap mid-line channel stop 328. The reasons for this is that, in practice, it is not possible to perfectly align masks. However, it is vital that any misalignment of masks not substantially affect the value of the difference beween the effective lengths of the "plus" and the "minus" sections of any split gate electrode of transversal filter. Specifically, misalignment which results in a decrease in the overlap of a channel stop by the "plus" section of a split gate electrode must also result in a substantially equal decrease in the overlap in the overlap of the "minus" section of that split gate electrode. Similarly, a misalignment which results in an increase in the overlap of the "plus" section of a split gate electrode must also result in a substantially equal increase in the overlap of the "minus" section of that split gate electrode.

What is claimed is:

1. In a CCD split electrode transversal filter operated by multi-phase clock voltages, said filter being of a type comprised of a semiconductor substrate surface on which a pair of substantially equidistant potential barriers defines a CCD channel of a given width, gate electrode extending said given width between said potential barriers, said gate electrodes being arranged in respective sets corresponding to each of said multi-phase clock voltages with the respective members of each set being distributed along the length of said channel in interleaved relationship with respective members of the other sets, certain members of a certain one of said sets each being split into a plurality of separated sections arranged in serial order across said given width, a "plus" summing bus electrically connecting together first corresponding sections of the members of said certain one of said sets, and a "minus" summing bus electrically connecting together second corresponding sections of said certain members of said certain one of said sets; the improvement:

wherein said certain members of said certain one of said sets are split into four sections having respective extents such that (1) the sum of the extents of the first and second sections in serial order is substantially one-half said given width of said channel and (2) the sum of the extents of the third and fourth sections in serial order is also substantially one-half said given width of said channel, first means including contacts for electrically connecting each one of a given pair of non-adjacent ones of said four sections of said certain members of said certain one of said sets to solely that one of the multi-phase clock voltages corresponding to said certain one of said sets, second means including contacts for electrically connecting first corresponding ones of the remaining pair of said four sections of said certain members of said certain one of said sets to said "plus" summing bus, and third means including contacts for electrically connecting second corresponding ones of the remaining pair of said four sections of said certain members of said certain one of said sets to said "minus" summing bus.

2. The filter defined in claim 1,
wherein one end of the first section of said certain members of said certain one of said sets is situated contiguous to one of said pair of potential barriers and one end of said fourth section of said certain members of said certain one of said sets is situated contiguous to the other of said pair of potential barriers, wherein one end of the second section and one end of the third section of said certain members of said certain one of said sets are situated contiguous to the mid-line of said channel, which mid-line divides said given width in half, wherein the respective positions of the other ends of said first and second sections and the other ends of said third and fourth sections of each certain member of said certain one of said sets varies from one certain member to another in dependence on the particular design characteristics of said filter, and wherein said contacts of said first and second and third means have fixed predetermined positions on the respective four sections of each certain member of said certain one of said sets, which fixed predetermined positions are independent of the particular design characteristics of said filter.

3. The filter defined in claim 2,
wherein said first means is electrically connected through its contacts to said first and fourth sections of each certain member of said certain one of said sets, said second means is electrically connected through its contacts to one of said second and third sections of each certain member of said certain one of said sets, and said third means selectively connected through its contacts to the other of said second and third sections of each certain member of said certain one of said sets, wherein said semiconductor substrate, at least in the vicinity of said substrate surface, is doped with carriers of a given conductivity, and wherein the respective separations between adjacent pairs of said sections of each certain member of said certain one of said sets define respective gaps, said gaps being implanted with carriers of a conductivity opposite to said given conductivity in sufficient concentration to form respective PN junctions with said substrate at said gaps.

4. The filter defined in claim 3,
wherein said one of said pair of potential barriers comprises a first channel-stop region at said substrate surface and said other of said pair of potential barriers comprises a second channel-stop region at said substrate surface, wherein each end portion including said one end of the first section of said certain members of said certain one of said sets overlies said first channel-stop region and each end portion including said one end of the fourth section of said certain members of said certain one of said sets overlies said second channel-stop region, and wherein said contacts of said first means are positioned on said respective end portions of said first sections and said fourth sections of said certain members of said certain one of said sets.

5. The filter defined in claim 2,
wherein said one of said pair of potential barriers comprises a first channel-stop region at said substrate surface and said other of said pair of potential barriers comprises a second channel-stop region at said substrate surface, wherein each end portion including said one end of the first section of said certain members of said certain one of said sets overlies said first channel-stop region and each end portion including said one end of the fourth section of said certain members of said certain one of said sets overlies said second channel-stop region, wherein said channel includes a third channel-stop region situated half-way between said first and second channel stop regions along the mid-line of said channel for dividing said channel into a first sub-channel situated between said first and third channel-stop regions and a second sub-channel situated between said second and third channel-stop regions, wherein each end portion including said one end of said second section and each end portion including said one end of said third section of said certain members of said certain one of said sets overlies said third channel-stop region, and wherein said first means includes contacts positioned on the respective end portions of said first and third sections, said second means includes contacts positioned on the end portions of the same given one of said second and fourth sections, and said third means include contacts positioned on the end portions of the other one from said given one of said second and fourth sections of said certain members of said certain one of said sets.

6. A CCD split gate electrode transversal filter including:
at least one triple-split gate electrode comprised of four serially-oriented longitudinal sections, wherein the sum of the lengths of the first two sections in serial order is substantially equal to the sum of the lengths of the last two sections in serial order, first means for operating two non-adjacent ones of said four sections as solely clock sections, and second means for operating the other two of said four sections, respectively, as a "plus" section and as a "minus" section of said filter.

7. The filter defined in claim 6,
wherein said first means operates the first and the fourth ones of said four sections in serial order as solely said clock sections.

8. The filter defined in claim 6,
wherein said first means operates the first and third ones of said four sections in serial order as solely said clock sections.

* * * * *